(12) United States Patent
Lu et al.

(10) Patent No.: US 10,164,646 B1
(45) Date of Patent: Dec. 25, 2018

(54) FREQUENCY GENERATOR WITH WARNING MECHANISM

(71) Applicant: TAIWAN SEMICONDUCTOR MANUFACTURING COMPANY LTD., Hsinchu (TW)

(72) Inventors: Shih-Lien Linus Lu, Hsinchu (TW); Cheng-En Lee, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/662,962

(22) Filed: Jul. 28, 2017

(51) Int. Cl.
*H03L 7/085* (2006.01)
*H03L 7/07* (2006.01)
*H03L 7/099* (2006.01)

(52) U.S. Cl.
CPC ............. *H03L 7/085* (2013.01); *H03L 7/07* (2013.01); *H03L 7/0992* (2013.01); *H03L 2207/50* (2013.01)

(58) Field of Classification Search
CPC ......... H03L 7/085; H03L 7/07; H03L 7/0992; H03L 2207/50; H03L 7/087; H03L 7/095
See application file for complete search history.

(56) References Cited

U.S. PATENT DOCUMENTS

| 6,828,863 | B2 * | 12/2004 | Itkin | H03B 21/02 327/105 |
| 2017/0346493 | A1 * | 11/2017 | Markulic | H03L 7/085 |
| 2017/0366192 | A1 * | 12/2017 | Moehlmann | H03L 7/091 |

OTHER PUBLICATIONS

Hsuan-Jung Hsu and Shi-Yu Huang, A Low-Jitter ADPLL via a Suppressive Digital Filter and an Interpolation-Based Locking Scheme, IEEE Transactions on Very Large Scale Integration (VLSI) Systems, Jan. 2011, p. 165-170, vol. 19, No. 1, IEEE.

* cited by examiner

*Primary Examiner* — Jung Kim
(74) *Attorney, Agent, or Firm* — WPAT, P.C., Intellectual Property Attorneys; Anthony King

(57) ABSTRACT

A frequency generator includes: a PLL circuit, arranged to generate a first output clock and a first lock signal, the first output clock being generated based on an input clock, the first lock signal being used to indicate whether the first PLL circuit is locked, wherein when the first PLL circuit is locked, a frequency of the first output clock is $N_1$ times a frequency of the input clock, and $N_1$ is a positive integer; and a second PLL circuit, arranged to generate a second output clock and a second lock signal, the second output clock being generated based on the input clock, the second lock signal being used to indicate whether the second PLL circuit is locked, wherein when the second PLL circuit is locked, a frequency of the second output clock is $N_2$ times the frequency of the input clock.

20 Claims, 4 Drawing Sheets

FREQUENCY GENERATOR WITH WARNING MECHANISM

BACKGROUND

Cryptographic computational devices have many applications both for the secure transmission of information and for the authentication and verification of the source of information. One application of a cryptographic computational device or system is a smart card, which contains valuable financial and personal data intended to be kept secret via encryption. These devices, for reason of unauthorized access and/or unlawful benefit, are made object of attacks for extracting their encrypted confidential information, and as a consequence, the security level of said devices may be compromised. Once this event occurs, the attacker can access the otherwise restricted information and capabilities of the device and is then at liberty to engage in malicious activities including authorization of monetary transactions, impersonation of digital signatures and so on. With the global increase in the use of cryptographic computational devices such as chip-based cards or special ICs for electronic identification and authentication protocols in computational devices such as mobile phones, it has become necessary for cryptographic devices to be tamper-proof by advantageous incorporation of features resistive to aforementioned attacks that concede data security.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. Specifically, dimensions of the various features may be arbitrarily increased or reduced for clarity of discussion.

DETAILED DESCRIPTION

Figure 1:
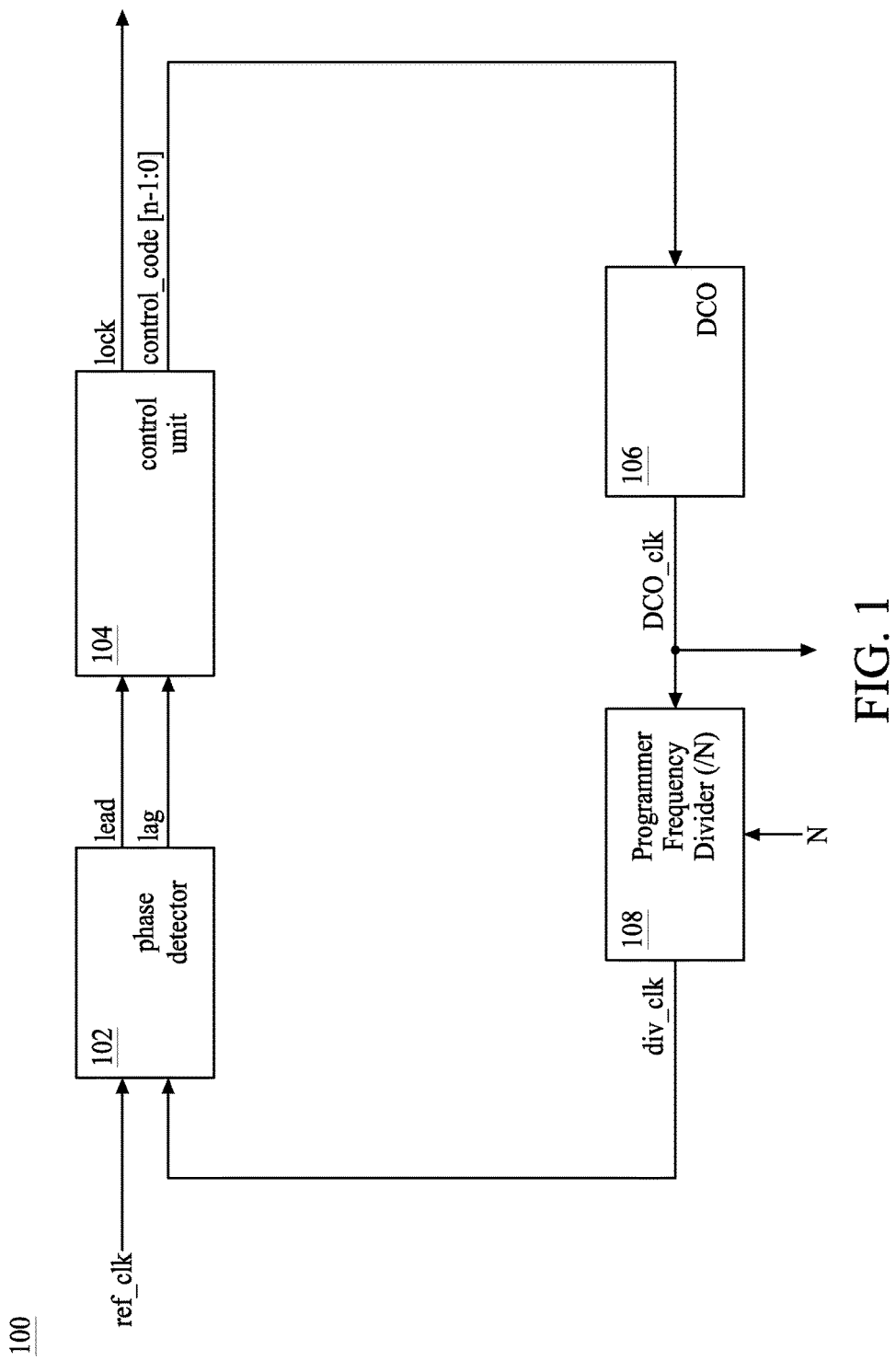
FIG. 1 is a diagram illustrating a phase-locked loop (PLL) circuit employed by the embodiments shown in FIG. 2 to FIG. 4 of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments and configurations discussed.

Further, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating or working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Cryptographic algorithms that normally go into the devices mentioned in the disclosure are usually designed not to reveal their inputs and/or outputs. However, cryptographic keys and computational intermediates of these algorithms may be open to access by an attacker thus compromising the security of the cryptographic device involved. Among classes of effective attacks known to be used with such intent, Differential Power Analysis (DPA) and Differential fault analysis (DFA) attacks are recognized as non-physical, non-invasive attacks which can be easily automated and can be mounted without knowing design of the target device. It would be therefore highly desirable to have mechanisms specifically resistive towards said attacks and yet be independent of the hardware involved.

DFA is a type of side channel attack where the principle is to induce faults or unexpected environmental conditions into cryptographic implementations, so as to reveal their internal states. Using DFA attacks, secret keys for cryptographic algorithms can be determined by selectively introducing scattered computation errors in the processor. For example, high temperature, unsupported supply voltage or current, excessively high overclocking, strong electric or magnetic fields, ionizing radiation may be used to influence operation of the processor on-board the cryptographic device which then begins to output incorrect results due to physical data correction thus revealing that the processor is running and details of its internal data state. Effective countermeasures to DFA types of attacks are hence acutely required for security of any product which needs to protect cryptographic keys and other secret information from being leaked.

The principle object of the present disclosure is to create a high level of security against excessively high overclocking DFA attacks on computational devices. The above object is achieved by a method for detection excessively high overclocking DFA attacks on computational devices.

Figure 2:
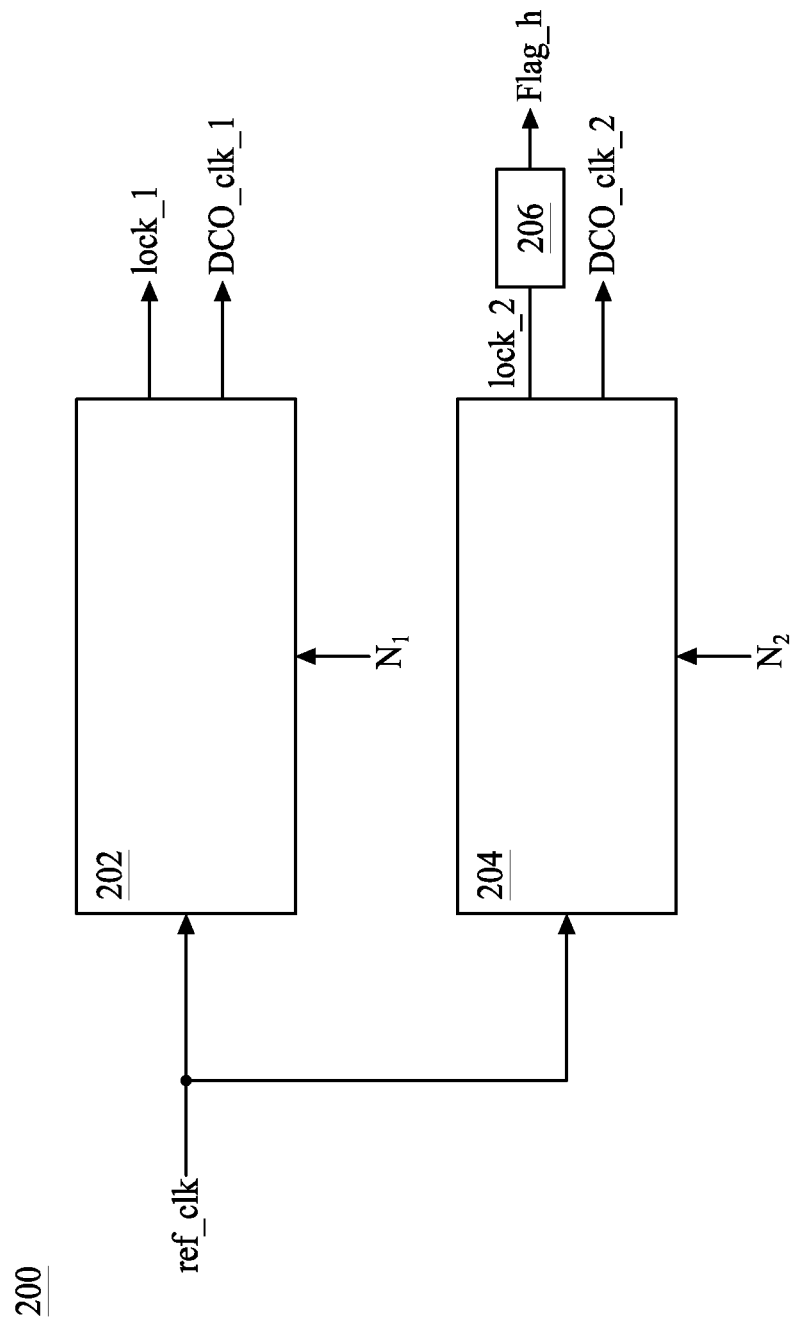
FIG. 2 is a diagram illustrating a frequency generator with a warning mechanism in accordance with an embodiment of the present disclosure.
Figure 3:
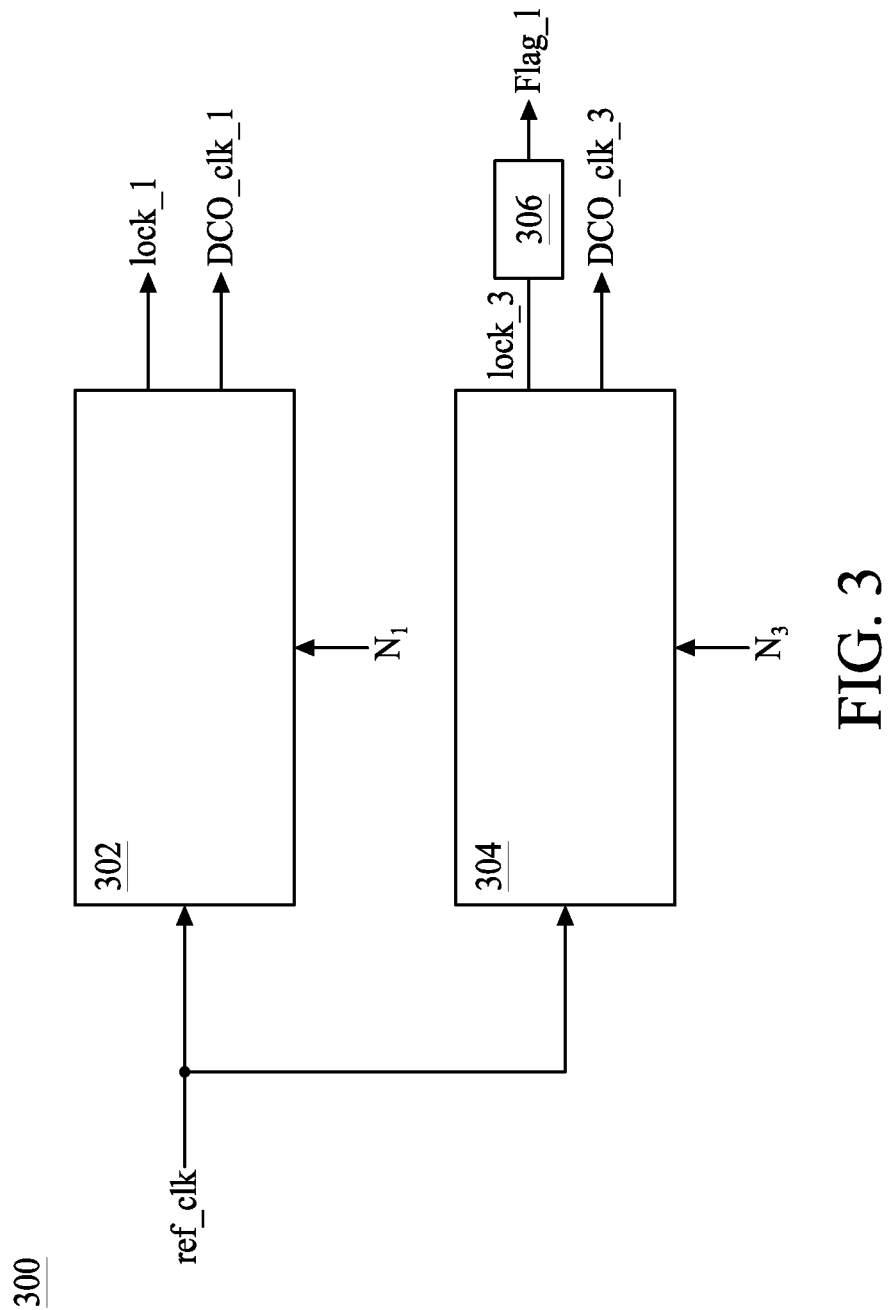
FIG. 3 is a diagram illustrating a frequency generator with a warning mechanism in accordance with another embodiment of the present disclosure.
Figure 4:
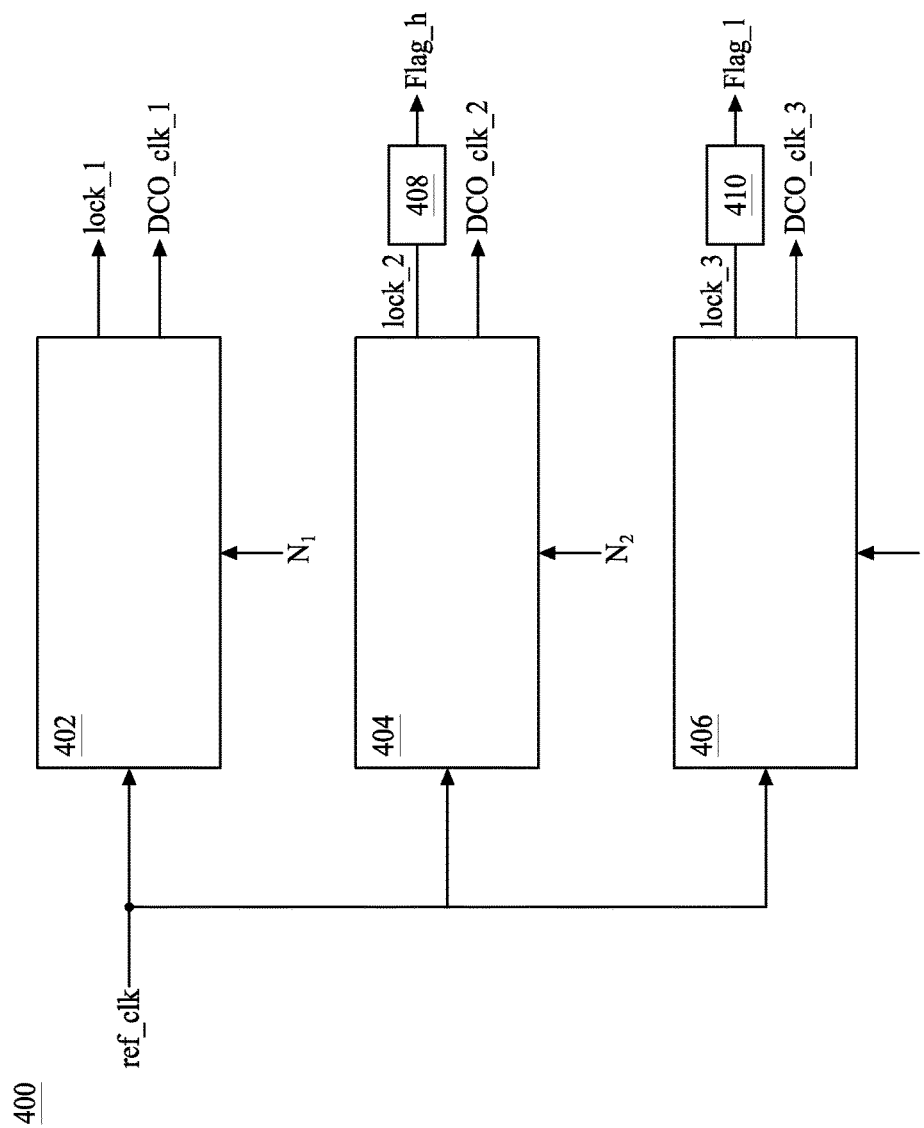
FIG. 4 is a diagram illustrating a frequency generator with a warning mechanism in accordance with still another embodiment of the present disclosure.

FIG. 1 is a diagram illustrating a phase-locked loop (PLL) circuit 100 employed by the embodiments shown in FIG. 2 to FIG. 4 of the present disclosure. In particular, the PLL is an all-digital phase-locked loop (ADPLL) circuit. The term "ADPLL" corresponds to a circuit which employs a digitally controlled oscillator (DCO) which produces an analog clock signal based on digital control codes. However, this is not a limitation of the present disclosure. Other different types of PLL may be within the contemplated scope of the present disclosure.

The ADPLL circuit 100 is a control system that generates a DCO output signal DCO_clk whose phase is adjusted in relation to a phase of an input reference clock signal ref_clk. The ADPLL circuit 100 includes a phase detector 102, a control unit 104, a DCO 106 and a programmer frequency divider 108. In the exemplary embodiment, the programmer frequency divider 108 is able to receive a frequency multiplicative factor N and performs the frequency division according to the frequency multiplicative factor N, where N is a positive number. As a consequence, a frequency of the DCO output signal DCO_clk generated by the DCO 106 is divided by N times to produce a divided clock signal div_clk. When a frequency of an ADPLL is locked (i.e., a frequency of the divided clock signal div_clk has substantially the same frequency as the input reference clock signal ref_clk), the frequency of the DCO output signal DCO_clk is N times the frequency of the input reference clock signal ref_clk. However, this is not a limitation of the present disclosure. In some embodiments, a non-programmer frequency divider with a predetermined frequency multiplicative factor is also within the contemplated scope of the present disclosure.

The DCO 106 inherently dictates the frequency range, i.e. a bandwidth, and a resolution that the ADPLL circuit 100 is able to synthesize. The DCO 106 is controlled by an n-bit control signal control_code in this embodiment, where n is a positive integer. A bit number of the n-bit control signal control_code is pertinent to the resolution of the ADPLL circuit 100 and is not a limitation of the present disclosure. The phase detector 102 is operative to compare a phase polarity between the input reference clock signal ref_clk and the divided clock signal div_clk. The phase detector 102 accordingly generates two mutually exclusive signals: lead and lag to show whose edge is leading. The control unit 104 is operative to generate the n-bit control signal control_code and a signal lock indicating a lock status of the ADPLL circuit 100 at least according to the signals lead and lag.

In some embodiments, at the beginning of a locking process of the ADPLL circuit 100, a frequency-locking process begins first since the initial frequency of the DCO 106 may be far from the target frequency. A coarse tune with a larger tuning step may be employed so as to make the frequency of the DCO 106 approach the target frequency, i.e. the frequency of the input reference clock signal ref_clk. Once the frequency of DCO 106 has been tuned as close as possible to the input reference clock signal ref_clk, a phase-locking process continues, mimicking the function of loop filter in an analog PLL. In a number of reference clock cycles, the control signal control_code gradually converges to a small range, indicating that the phase has also been locked to the input reference clock signal ref_clk and the target frequency has been synthesized. The signal lock is asserted when the control signal control_code gradually converges to a range smaller than a predetermined threshold.

FIG. 2 is a diagram illustrating a frequency generator 200 with a warning mechanism in accordance with an embodiment of the present disclosure. As mentioned above, the principle object of the present disclosure is to create a high level of security against excessively high overclocking DFA attacks on computational devices. Except working as a frequency synthesizer or frequency generator, the frequency generator 200 shown in FIG. 2 is capable of detecting excessively high overclocking DFA attacks and issuing warning as well. The present disclosure is focusing on the warning mechanism. However, further associated countermeasures in response to the warning are also within the contemplated scope of the present disclosure.

The frequency generator 200 may be embedded in a cryptographic computational device or system, such as a smart card or other computational devices such as mobile phones, which contains valuable financial and personal data which intended to be kept secret via encryption. These devices, for reason of unauthorized access and/or unlawful benefit, are made object of attacks for extracting their encrypted confidential information, and as a consequence, the security level of said devices may be compromised. Once this event occurs, the attacker can access the otherwise restricted information and capabilities of the device and is then at liberty to engage in malicious activities including authorization of monetary transactions, impersonation of digital signatures and so on. The frequency generator 200 embedded in cryptographic devices is tamper-proof by advantageous incorporation of features resistive to aforementioned attacks that concede data security.

The frequency generator 200 includes a first ADPLL circuit 202 and a second ADPLL circuit 204. In the exemplary embodiment, each of the first ADPLL circuit 202 and the second ADPLL circuit 204 includes the ADPLL circuit 100 shown in FIG. 1. In particular, the first ADPLL circuit 202 may be structurally the same with the second ADPLL circuit 204, and the first ADPLL circuit 202 and the second ADPLL circuit 204 may have the same bandwidth. In particular, the first ADPLL circuit 202 and the second ADPLL circuit 204 may have the same DCO bandwidth. The second ADPLL circuit 204 may have a purpose different from and the first ADPLL circuit 202. In the exemplary embodiment, the first ADPLL circuit 202 is configured to be a clock synthesizer, and the second ADPLL circuit 204 is configured to be an attack monitor.

The first ADPLL circuit 202 includes at least a first input terminal and a second input terminal to receive an input reference clock signal ref_clk and a frequency multiplicative factor $N_1$ respectively, where $N_1$ is a positive number. The first ADPLL circuit 202 includes at least a first output terminal and a second output terminal. A signal lock_1 output from the first output terminal of the first ADPLL circuit 202 is used to indicate whether a locking process of the first ADPLL circuit 202 is stable. In other words, when the first ADPLL circuit 202 converges to a range smaller than a predetermined threshold as mentioned in the paragraphs discussing FIG. 1, the signal lock_1 is asserted. A DCO output signal DCO_clk_1 output from the second output terminal of the first ADPLL circuit 202 has a frequency $N_1$ times the frequency of the input reference clock signal ref_clk.

The second ADPLL circuit 204 includes at least a first input terminal and a second input terminal to receive the input reference clock signal ref_clk and a frequency multiplicative factor $N_2$ respectively, where $N_2$ is a positive number. The second ADPLL circuit 204 includes two output terminals like the first ADPLL circuit 202. A signal lock_2 from the first output terminal of the second ADPLL circuit 204 is used to indicate whether a locking process of the second ADPLL circuit 204 is stable. In other words, when the second ADPLL circuit 204 converges to a range smaller than a predetermined threshold 1, the signal lock_2 is asserted. A DCO output signal DCO_clk_2 output from the second output terminal of the second ADPLL circuit 204 has a frequency $N_2$ times the frequency of the input reference clock signal ref_clk. The signal lock_2 output by the second ADPLL circuit 204 is coupled to a flag generation unit 206 for generating a flag signal Flag_h. The flag signal Flag_h is used to indicate whether the input reference clock signal ref_clk is overclocked. For example, the flag signal Flag_h may be generated by inverting the signal lock_2 of the second ADPLL circuit 204. In some embodiments, the flag generation unit 206 waits for a predetermined time period, and when the signal lock_2 is still not asserted after the predetermined time period, the flag generation unit 206 asserts the flag signal Flag_h. The details are described in the ensuing discussion.

When the frequency generator 200 is embedded in a cryptographic computational device or system, the cryptographic computational device or system may require a crystal oscillator, which provides the frequency generator 200 with an accurate frequency reference. The crystal oscillator may be external to the frequency generator 200. In a case where an attacker intends to remove the crystal oscillator and feeds an overclocked input reference clock signal ref_clk to the frequency generator 200 in order to knock on the side of the cryptographic computational device or system, the second ADPLL circuit 204, as an attack monitor, is in charge of detecting such a case. In short, the second ADPLL circuit 204 is able to monitor the input reference clock signal ref_clk and see if the input reference clock signal ref_clk is overclocked. Once the input reference clock signal ref_clk is regarded to be overclocked, the second ADPLL circuit 204 of the frequency generator 200 keeps the flag signal Flag_h asserted and activate any possible countermeasures.

To put it another way, the exemplary embodiment intends to issue an alert when the input reference clock signal ref_clk is out of a predetermined bandwidth. For example, the input reference clock signal ref_clk may be restricted to no higher than a predetermined upper bound, otherwise the input reference clock signal ref_clk is deemed to be tampered. For example, when the frequency of the input reference clock signal ref_clk is greater than the predetermined upper bound, the flag signal Flag_h is kept asserted to indicate the cryptographic computational device or system where the frequency generator 200 is embedded in is attacked.

In order to achieve the idea, the frequency multiplicative factor $N_2$ of the second ADPLL circuit 204 may be configured to be greater than the frequency multiplicative factor $N_1$ of the first ADPLL circuit 202. In the exemplary embodiment, the frequency multiplicative factor $N_2$ of the second ADPLL circuit 204 is $k_h$ times the frequency multiplicative factor $N_1$ of the first ADPLL circuit 202, where $k_h$ is greater than 1. Since the first ADPLL circuit 202 is configured to be a clock synthesizer for the cryptographic computational device or system where the frequency generator 200 is embedded in, the frequency multiplicative factor $N_1$ may be determined according to design requirement regarding operating frequency of the cryptographic computational device or system. The second ADPLL circuit 204 is configured to be an attack monitor with the frequency multiplicative factor $N_2$ greater than the frequency multiplicative factor $N_1$ of the first ADPLL circuit 202 by $k_h$ times. Therefore, when the input reference clock signal ref_clk keeps increasing, the first thing to happen is the second ADPLL circuit 204 being out of lock because $N_2$ times the frequency of the input reference clock signal ref_clk exceeds an upper bound of the bandwidth of the DCO of the second ADPLL circuit 204.

Once $N_2$ times the frequency of the input reference clock signal ref_clk exceeds the upper bound of the bandwidth of the DCO of the second ADPLL circuit 204, the signal lock is never asserted and the flag signal Flag_h is asserted. In this way, it can be identified that the input reference clock signal ref_clk is abnormally high. The value of $k_h$ directly reflects the predetermined upper bound used to confine the input reference clock signal ref_clk. A higher $k_h$ leads to a lower predetermined upper bound, and vice versa.

FIG. 3 is a diagram illustrating a frequency generator 300 with a warning mechanism in accordance with another embodiment of the present disclosure. The frequency generator 300, like the frequency generator 200, may be embedded in a cryptographic computational device or system as well. The frequency generator 300 includes a first ADPLL circuit 302 and a second ADPLL circuit 304. The frequency generator 300 may be structurally the same with the frequency generator 200. The first ADPLL circuit 302 and the second ADPLL circuit 304 may have the same bandwidth. In particular, the first ADPLL circuit 302 and the second ADPLL circuit 304 may have the same DCO bandwidth. The difference between the frequency generator 300 and the frequency generator 200 is that the second ADPLL circuit 304 is employed to detect whether the input reference clock signal ref_clk is underclocked instead of overclocked. The second ADPLL circuit 304 is able to monitor the input reference clock signal ref_clk and see if the input reference clock signal ref_clk is underclocked. A DCO output signal DCO_clk_3 from the second output terminal of the second ADPLL circuit 304 has a frequency $N_3$ times the frequency of the input reference clock signal ref_clk.

A signal lock_3 output by the second ADPLL circuit 304 is coupled to a flag generation unit 306 for generating a flag signal Flag_l. The flag signal Flag_l is used to indicate whether the input reference clock signal ref_clk is underclocked. For example, the flag signal Flag_l may be generated by inverting the signal lock_3 of the second ADPLL circuit 304. In some embodiments, the flag generation unit 306 waits for a predetermined time period, and when the signal lock_3 is still not asserted after the predetermined time period, the flag generation unit 306 asserts the flag signal Flag_l. Once the input reference clock signal ref_clk is regarded to be underclocked, the second ADPLL circuit 304 of the frequency generator 300 is able to keep the flag signal Flag_l asserted and activate any possible countermeasures.

To put it another way, the exemplary embodiment intends to issue an alert when the input reference clock signal ref_clk is out of a predetermined bandwidth. For example, the input reference clock signal ref_clk may be restricted to no lower than a predetermined lower bound, otherwise the input reference clock signal ref_clk is deemed to be tampered. For example, when the frequency of the input reference clock signal ref_clk is less than the predetermined lower bound, the flag signal Flag_l is kept asserted to indicate the cryptographic computational device or system where the frequency generator 300 is embedded in is attacked.

In order to achieve the idea, a frequency multiplicative factor $N_3$ of the second ADPLL circuit 304 may be configured to be less than a frequency multiplicative factor $N_1$ of the first ADPLL circuit 302. In the exemplary embodiment, the frequency multiplicative factor $N_3$ of the second ADPLL circuit 304 is $k_l$ times the frequency multiplicative factor $N_1$ of the first ADPLL circuit 302, where $k_l$ is less than 1. Since the first ADPLL circuit 302 is configured to be a clock synthesizer for the cryptographic computational device or system where the frequency generator 300 is embedded in, the frequency multiplicative factor $N_1$ may be determined according to design requirement regarding operating frequency of the cryptographic computational device or system. The second ADPLL circuit 304 is configured to be an attack monitor with the frequency multiplicative factor $N_3$ less than the frequency multiplicative factor $N_1$ of the first ADPLL circuit 302 by $k_l$ times. Therefore, when the input reference clock signal ref_clk keeps decreasing, the first thing to happen is the second ADPLL circuit 304 being out of lock because $N_3$ times the frequency of the input reference clock signal ref_clk is less than a lower bound of the bandwidth of the DCO of the second ADPLL circuit 304.

Once $N_3$ times the frequency of the input reference clock signal ref_clk is less than the lower bound of the bandwidth of the DCO of the second ADPLL circuit 304, the signal lock is never asserted and the flag signal Flag_l is asserted. In this way, it can be identified that the input reference clock signal ref_clk is abnormally low. The value of $k_l$ directly reflects the predetermined lower bound used to confine the input reference clock signal ref_clk. A lower $k_l$ leads to a higher predetermined lower bound, and vice versa.

FIG. 4 is a diagram illustrating a frequency generator 400 with a warning mechanism in accordance with still another embodiment of the present disclosure. The frequency generator 400, like the frequency generators 200 and 300, may be embedded in a cryptographic computational device or system as well. The frequency generator 400 includes a first ADPLL circuit 402, a second ADPLL circuit 404 and a third ADPLL circuit 406. The first ADPLL circuit 402, the second ADPLL circuit 404 and the third ADPLL circuit 406 may be structurally the same and have the same bandwidth. In particular, the first ADPLL circuit 402, the second ADPLL circuit 404 and the third ADPLL circuit 406 may have the same DCO bandwidth. The first ADPLL circuit 402 is employed as a clock synthesizer like the first ADPLL circuit 202 and the first ADPLL circuit 302. The second ADPLL circuit 404, like the second ADPLL circuit 204, is employed as an attack monitor to detect whether the input reference clock signal ref_clk is overclocked. The third ADPLL circuit 406, like the second ADPLL circuit 304, is employed as an attack monitor to detect whether the input reference clock signal ref_clk is underclocked.

In this embodiment, the generation of the flag signal Flag_h and the flag signal Flag_l is similar to the embodiment shown in FIG. 2 and FIG. 3. Once the input reference clock signal ref_clk is regarded to be overclocked, the second ADPLL circuit 404 of the frequency generator 400 is able to keep the flag signal Flag_h asserted and activate any possible countermeasures. On the other hand, once the input reference clock signal ref_clk is regarded to be underclocked, the third ADPLL circuit 406 of the frequency generator 400 is able to keep the flag signal Flag_l asserted and activate any possible countermeasures. In short, the frequency generator 400 combines the features of the frequency generators 200 and 300, and details are omitted here for conciseness.

Some embodiment of the present disclosure provides a frequency generator. The frequency generator includes: a first phase-locked loop (PLL) circuit, arranged to generate a first output clock and a first lock signal, the first output clock being generated based on an input clock, the first lock signal being used to indicate whether the first PLL circuit is locked, wherein when the first PLL circuit is locked, a frequency of the first output clock is $N_1$ times a frequency of the input clock, and $N_1$ is a positive integer; and a second PLL circuit, arranged to generate a second output clock and a second lock signal, the second output clock being generated based on the input clock, the second lock signal being used to indicate whether the second PLL circuit is locked, wherein when the second PLL circuit is locked, a frequency of the second output clock is $N_2$ times the frequency of the input clock, and $N_2$ is a positive integer greater than $N_1$.

Some embodiment of the present disclosure provides a frequency generator. The frequency generator includes: a first all-digital phase-locked loop (ADPLL) circuit, including: a first phase detector, arranged to receive an input clock and a first divided clock and generate at least a first phase detection signal to indicate a phase relationship between the input clock and the first divided clock; a first control unit, arranged to generate a first control code and a first lock signal according to the first phase detection signal; a first digitally controlled oscillator (DCO), having a first bandwidth, the first DCO being arranged to generate a first DCO clock having a first output frequency according to the first control code; and a first programmable frequency divider, arranged to receive a first frequency multiplicative factor and divide the first output frequency of the first DCO clock by the first frequency multiplicative factor to generate the first divided clock; and a second ADPLL circuit, including: a second phase detector, arranged to receive the input clock and a second divided clock and generate at least a second phase detection signal to indicate a phase relationship between the input clock and the second divided clock; a second control unit, arranged to generate a second control code and a second lock signal according to the second phase detection signal; a second DCO, having a second bandwidth, the second DCO being arranged to generate a second DCO clock having a second output frequency according to the second control code; and a second programmable frequency divider, arranged to receive a second frequency multiplicative factor and divide the second output frequency of the second DCO clock by the second frequency multiplicative factor to generate the second divided clock; wherein the second frequency multiplicative factor is greater than the first frequency multiplicative factor.

Some embodiment of the present disclosure provides a frequency generator. The frequency generator includes: a first phase-locked loop (PLL) circuit, arranged to generate a first output clock and a first lock signal, the first output clock being generated based on an input clock, the first lock signal being used to indicate whether the first PLL circuit is locked, wherein when the first PLL circuit is locked, a frequency of the first output clock is $N_1$ times a frequency of the input clock, and $N_1$ is a positive integer; a second PLL circuit, arranged to generate a second output clock and a second lock signal, the second output clock being generated based on the input clock, the second lock signal being used to indicate whether the second PLL circuit is locked, wherein when the second PLL circuit is locked, a frequency of the second output clock is $N_2$ times the frequency of the input clock, and $N_2$ is a positive integer less than $N_1$; and a flag generation unit coupled to the second PLL circuit, the flag generation unit being arranged to generate a flag signal to indicate whether the frequency of the input clock is under a predetermined lower bound according to the second lock signal.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A frequency generator, comprising:
   a first phase-locked loop (PLL) circuit, arranged to generate a first output clock and a first lock signal, the first output clock being generated based on an input clock, the first lock signal being used to indicate whether the first PLL circuit is locked, wherein when the first PLL circuit is locked, a frequency of the first output clock is $N_1$ times a frequency of the input clock, and $N_1$ is a positive integer;
   a second PLL circuit, arranged to generate a second output clock and a second lock signal, the second output clock being generated based on the input clock, the second lock signal being used to indicate whether the second PLL circuit is locked, wherein when the second PLL circuit is locked, a frequency of the second output clock is $N_2$ times the frequency of the input clock, and $N_2$ is a positive integer greater than $N_1$; and
   a flag generation unit coupled to the second PLL circuit, the flag generation unit being arranged to generate a flag signal to indicate whether the frequency of the input clock is over a predetermined upper bound.

2. The frequency generator of claim 1, wherein the first PLL circuit includes a first digitally controlled oscillator (DCO) having a first bandwidth.

3. The frequency generator of claim 2, wherein the second PLL circuit includes a second DCO having a second bandwidth substantially the same with the first bandwidth of the first DCO.

4. The frequency generator of claim 1, wherein when the second lock signal indicates the second PLL is not locked, the flag generation unit asserts the flag signal to indicate the frequency of the input clock is over the predetermined upper bound.

5. The frequency generator of claim 4, wherein when the second lock signal indicates the second PLL is not locked for a predetermined time period, the flag generation unit asserts the flag signal to indicate the frequency of the input clock is over the predetermined upper bound.

6. The frequency generator of claim 1, wherein $N_2$ is determined according to the predetermined upper bound.

7. The frequency generator of claim 6, wherein $N_2$ is determined further according to the second bandwidth of the second DCO.

8. The frequency generator of claim 1, further comprising:
   a third PLL circuit, arranged to generate a third output clock and a third lock signal, the third output clock being generated based on the input clock, the third lock signal being used to indicate whether the third PLL circuit is locked, wherein when the third PLL circuit is locked, a frequency of the third output clock is $N_3$ times the frequency of the input clock, and $N_3$ is a positive integer less than $N_1$.

9. A frequency generator, comprising:
   a first all-digital phase-locked loop (ADPLL) circuit, including:
      a first phase detector, arranged to receive an input clock and a first divided clock and generate at least a first phase detection signal to indicate a phase relationship between the input clock and the first divided clock;
      a first control unit, arranged to generate a first control code and a first lock signal according to the first phase detection signal;
      a first digitally controlled oscillator (DCO), having a first bandwidth, the first DCO being arranged to generate a first DCO clock having a first output frequency according to the first control code; and
      a first programmable frequency divider, arranged to receive a first frequency multiplicative factor and divide the first output frequency of the first DCO clock by the first frequency multiplicative factor to generate the first divided clock;
   a second ADPLL circuit, including:
      a second phase detector, arranged to receive the input clock and a second divided clock and generate at least a second phase detection signal to indicate a phase relationship between the input clock and the second divided clock;
      a second control unit, arranged to generate a second control code and a second lock signal according to the second phase detection signal;
      a second DCO, having a second bandwidth, the second DCO being arranged to generate a second DCO clock having a second output frequency according to the second control code; and
      a second programmable frequency divider, arranged to receive a second frequency multiplicative factor and divide the second output frequency of the second DCO clock by the second frequency multiplicative factor to generate the second divided clock; and
   an overclock flag generation unit coupled to the second control unit, the overclock flag generation unit being arranged to generate an overclock flag signal according to the second lock signal to indicate whether a frequency of the input clock is over a predetermined upper bound;
   wherein the second frequency multiplicative factor is greater than the first frequency multiplicative factor.

10. The frequency generator of claim 9, wherein the first bandwidth is substantially the same with the second bandwidth.

11. The frequency generator of claim 9, wherein the second frequency multiplicative factor is determined according to the predetermined upper bound.

12. The frequency generator of claim 11, further comprising:
a third ADPLL circuit, including:
a third phase detector, arranged to receive the input clock and a third divided clock and generate at least a third phase detection signal to indicate a phase relationship between the input clock and the third divided clock;
a third control unit, arranged to generate a third control code and a third lock signal according to the third phase detection signal;
a third DCO, having a third bandwidth, the third DCO being arranged to generate a third DCO clock having a third output frequency according to the third control code; and
a third programmable frequency divider, arranged to receive a third frequency multiplicative factor and divide the third output frequency of the third DCO clock by the third frequency multiplicative factor to generate the third divided clock;
wherein the third frequency multiplicative factor is less than the first frequency multiplicative factor.

13. The frequency generator of claim 12, wherein the third bandwidth is substantially the same with the first bandwidth and the second bandwidth.

14. The frequency generator of claim 13, further comprising:
an underclock flag generation unit coupled to the third control unit, the underclock flag generation unit being arranged to generate an underclock flag signal according to the third lock signal to indicate whether the frequency of the input clock is under a predetermined lower bound.

15. The frequency generator of claim 14, wherein the third frequency multiplicative factor is determined according to the predetermined lower bound.

16. A frequency generator, comprising:
a first phase-locked loop (PLL) circuit, arranged to generate a first output clock and a first lock signal, the first output clock being generated based on an input clock, the first lock signal being used to indicate whether the first PLL circuit is locked, wherein when the first PLL circuit is locked, a frequency of the first output clock is $N_1$ times a frequency of the input clock, and $N_1$ is a positive integer;
a second PLL circuit, arranged to generate a second output clock and a second lock signal, the second output clock being generated based on the input clock, the second lock signal being used to indicate whether the second PLL circuit is locked, wherein when the second PLL circuit is locked, a frequency of the second output clock is $N_2$ times the frequency of the input clock, and $N_2$ is a positive integer less than $N_1$; and
a flag generation unit coupled to the second PLL circuit, the flag generation unit being arranged to generate a flag signal to indicate whether the frequency of the input clock is under a predetermined lower bound according to the second lock signal.

17. The frequency generator of claim 16, wherein the first PLL circuit includes a first digitally controlled oscillator (DCO) having a first bandwidth.

18. The frequency generator of claim 17, wherein the second PLL circuit includes a second DCO having a second bandwidth substantially the same with the first bandwidth of the first DCO.

19. The frequency generator of claim 16, wherein when the second lock signal indicates the second PLL is not locked, the flag generation unit asserts the flag signal to indicate the frequency of the input clock is under the predetermined lower bound.

20. The frequency generator of claim 19, wherein when the second lock signal indicates the second PLL is not locked for a predetermined time period, the flag generation unit asserts the flag signal to indicate the frequency of the input clock is under the predetermined lower bound.

* * * * *